US006128478A

United States Patent [19]

Kim

[11] Patent Number: 6,128,478

[45] Date of Patent: Oct. 3, 2000

[54] APPARATUS AND METHOD FOR AMPLIFYING A RADIO FREQUENCY SIGNAL

[75] Inventor: Kevin Kim, Buffalo Grove, Ill.

[73] Assignee: Motorola, Inc., Schaumburg, Ill.

[21] Appl. No.: 09/126,828

[22] Filed: Jul. 31, 1998

[51] Int. Cl.[7] .................... H04B 1/16

[52] U.S. Cl. .................... 455/116; 455/137; 455/200.1; 330/12 R; 375/316; 375/345

[58] Field of Search .................... 455/127, 126, 455/116, 114, 200.1, 136, 137; 330/124 R, 150, 295, 310; 375/261, 279, 316, 340, 329, 332, 295, 297, 345

[56] References Cited

U.S. PATENT DOCUMENTS

| | | | |
|---|---|---|---|
| 3,886,470 | 5/1975 | O'Neil et al. | 330/149 |
| 5,448,771 | 9/1995 | Klomsdorf et al. | 455/126 |
| 5,537,080 | 7/1996 | Chawla et al. | 330/266 |
| 5,808,512 | 9/1998 | Bainvoll et al. | 330/151 |
| 5,867,064 | 2/1999 | Horn et al. | 330/149 |
| 5,969,572 | 10/1999 | Jeong et al. | 330/149 |
| 5,974,041 | 10/1999 | Kornfeld et al. | 370/342 |

*Primary Examiner*—Lee Nguyen
*Assistant Examiner*—Isaak R. Jama
*Attorney, Agent, or Firm*—Daniel C. Crilly; Steven A. May; Jeffrey K. Jacobs

[57] ABSTRACT

A communication device employs a method and apparatus for amplifying a radio frequency (RF) signal that eliminates the need for a signal splitter. An RF input signal (202) is coupled to a first RF amplifier stage (206) only. A signal coupler (222) couples an output of the first amplifier stage (206) to an input of a second amplifier stage (208). The input signal (242) for the second RF amplifier stage is an attenuated version of the output signal (240) from the first RF amplifier stage. The outputs of the first and second RF amplifier stages (206, 208) are combined by a signal combiner (234) to produce a combined output signal (246) for transmission.

10 Claims, 5 Drawing Sheets

—PRIOR ART—

APPARATUS AND METHOD FOR AMPLIFYING A RADIO FREQUENCY SIGNAL

FIELD OF THE INVENTION

This invention relates generally to wireless communication devices, and, in particular, to the structure of a radio frequency amplifier in such a communication device.

BACKGROUND OF THE INVENTION

Radio frequency (RF) power amplifier structures achieve high RF power by operating RF amplifier circuits in parallel, splitting one or more RF signals among the inputs to each of the parallel circuits. One such RF power amplifier structure is shown in FIG. 1. The RF power amplifier 100 comprises two RF amplifier stages 104, 106 configured to operate in parallel, a signal splitter 102, a signal combiner 128, and a phase-matching transmission line 126. Each RF amplifier stage 104, 106 typically includes a class AB RF amplifier 116, 122, an input matching circuit 114, 120, and an output matching circuit 118, 124.

The signal splitter 102 typically comprises a three decibel (dB) splitter that includes two 70.7 ohm, one-quarter wavelength transmission lines 108, 110 and a 100 ohm isolation resistor 112. The signal combiner 128 typically comprises a one-quarter wavelength transmission line transformer 130 having a nominal characteristic impedance of 70.7 ohms. The phase-matching transmission line 126 comprises a one-quarter wavelength transmission line having a nominal characteristic impedance of 50 ohms and is used to offset the one-quarter wavelength phase shift introduced by the signal combiner 128.

When an RF signal 134 is applied to the RF power amplifier 100, the signal splitter 102 divides the RF signal into two equi-amplitude RF signals. The signal splitter 102 also isolates the RF amplifier stages 104, 106 from each other via the isolation resistor 112. RF amplifier stage 104 applies a gain to one of the equi-amplitude RF signals to produce a first amplified RF signal. Similarly, RF amplifier stage 106 applies a gain to the other equi-amplitude RF signal to produce a second amplified RF signal. The RF gains applied by the RF amplifier stages 104, 106 are generally equal since the RF amplifiers 116, 122 are often the same active devices (e.g., RF power transistors).

The signal combiner 128 then combines the first and second amplified RF signals to produce a combined output signal. The phase-matching transmission line 126 introduces a one-quarter wavelength phase shift to the RF signal applied to RF amplifier stage 106 to compensate for the one-quarter wavelength phase shift introduced by the signal combiner 128 to the first amplified RF signal produced by RF amplifier stage 104, so that the first and second amplified RF signals will be in phase when combined.

A drawback to the RF amplifier structure depicted in FIG. 1 is that the use of a 3 dB signal splitter reduces the potential gain of the configuration. For example, suppose the RF amplifiers 116, 122 are power transistors that provide 10 dB of gain at the frequency of interest. Operating in parallel, the two transistors can produce a combined output signal of 100 watts (50 decibels above a milliwatt (dBm)). In order to produce 50 watts each, each transistor 116, 122 requires 5 watts (37 dBm) of input power since its gain is 10 dB. For the signal splitter 102 to provide each transistor 116, 122 with 5 watts of input power, the signal splitter 102 requires an input RF signal 134 of 10 watts (40 dBm), since a 3 dB splitter divides the input power equally between the two RF amplifier stages 104, 106. Thus, the gain of the RF amplifier structure in this example would be 10 dB (i.e., 10 watts (40 dBm) of input power to produce 100 watts (50 dBm) of output power).

As a further example, suppose that instead of two RF amplifier stages in parallel preceded by a signal splitter, there are four RF amplifier stages in parallel, each pair of stages preceded by a 3 dB signal splitter and the inputs to the two signal splitters coupled to the outputs of a third 3 dB signal splitter. For each of the two pairs of parallel amplifier stages to produce an output signal of 100 watts, or 200 watts when the outputs of both pairs are combined, each of the two signal splitters immediately preceding the amplifier stages requires 10 watts of input power. To provide 10 watts to each of the two signal splitters, the third 3 dB signal splitter requires 20 watts of input power. Again, the gain for the entire configuration of four parallel RF amplifier stages is 10 dB (i.e., 20 watts (43 dBm) input power to produce 200 watts (53 dBm) of output power).

If the signal splitter could be eliminated and more gain could be obtained out of the above exemplary RF amplifier configurations using the same RF power transistors, a number of design advantages and cost savings may be realized. One design advantage is that the RF power transistors would not have to be operated at their specified gain levels. By operating each transistor at less than the transistor's specified gain (e.g., by requiring less than 10 dB of gain per transistor), the design would be more tolerant to natural variations in gains between devices. Second, if the configurations had more overall gain, then they would require less input power from preceding RF amplifier stages. Reducing the power required from preceding RF amplifier stages could permit the use of lower power, less expensive RF power transistors in a preceding RF amplifier stage. Also, requiring less input power might allow for the elimination of one of several preceding RF amplification stages, thus eliminating the need for one or more RF power transistors altogether. Since the RF power transistors are among the most costly components in a high power transmitter, the cost savings could be significant.

Therefore, a need exists for a method and apparatus for amplifying RF signals that eliminates the need for a signal splitter and thereby increases the gain of an RF power amplifier configuration.

DESCRIPTION OF A PREFERRED EMBODIMENT

Generally, the present invention encompasses an apparatus and method for amplifying a radio frequency (RF) signal.

A first RF amplifier stage applies a first gain to an RF input signal to produce a first amplified RF signal. A signal coupler couples a portion of the first amplified RF signal to an input of a second RF amplifier stage. The second RF amplifier stage applies a second gain to the coupled portion of the first amplified RF signal to produce a second amplified RF signal. The outputs of the first and second RF amplifier stages are then combined in a signal combiner to produce a combined output signal. Since a portion of the output of the first RF amplifier stage is used as the input signal for the second RF amplifier stage, the need for a signal splitter is eliminated and the RF input signal need only be of sufficient power to drive one RF amplifier stage. By contrast, in a typical RF power amplifier configuration, the RF input signal is split among multiple RF amplifier stages and must be of sufficient power to drive the multiple stages simultaneously.

Figure 1:
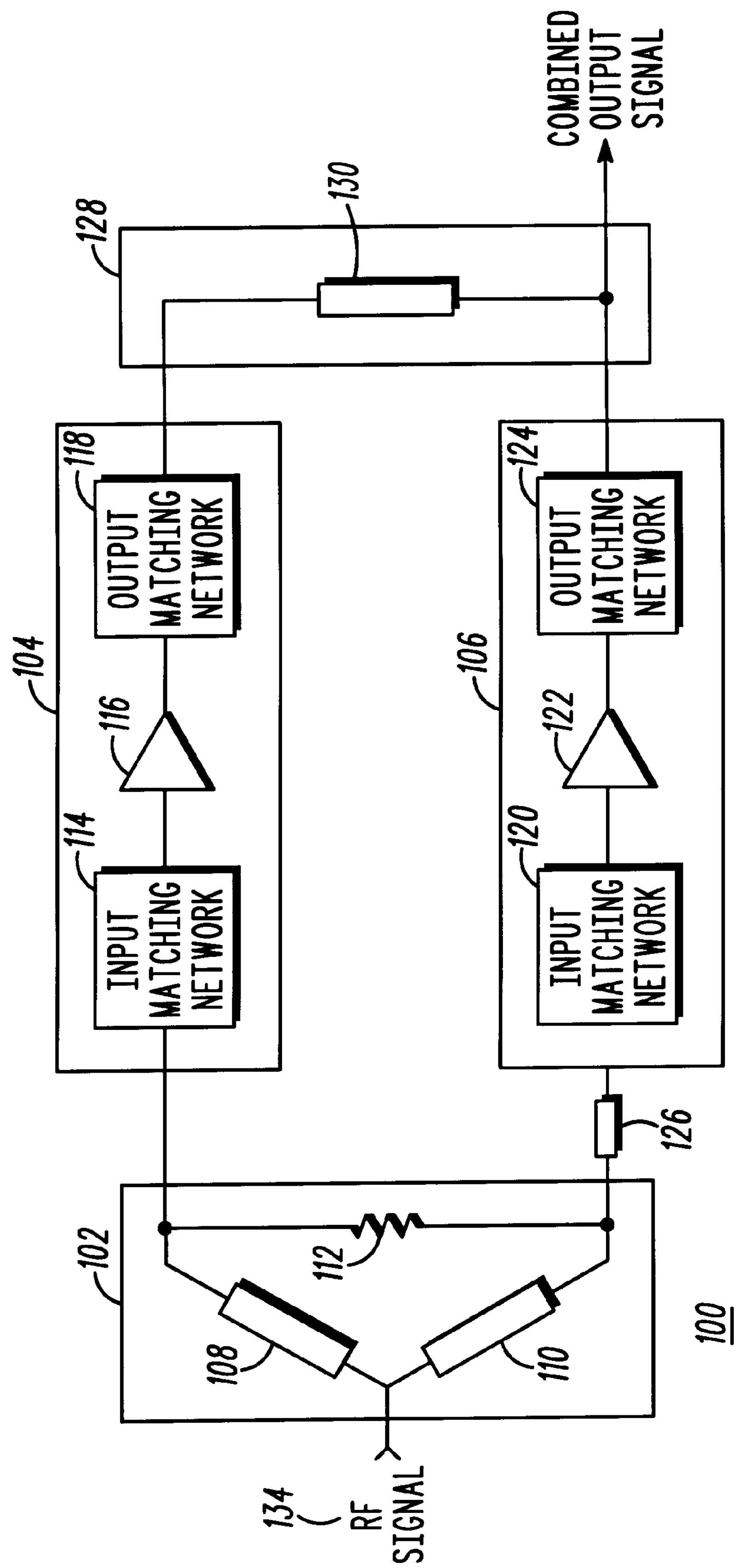
FIG. 1 is a schematic and block diagram illustration of a typical radio frequency amplifier structure.
Figure 2:
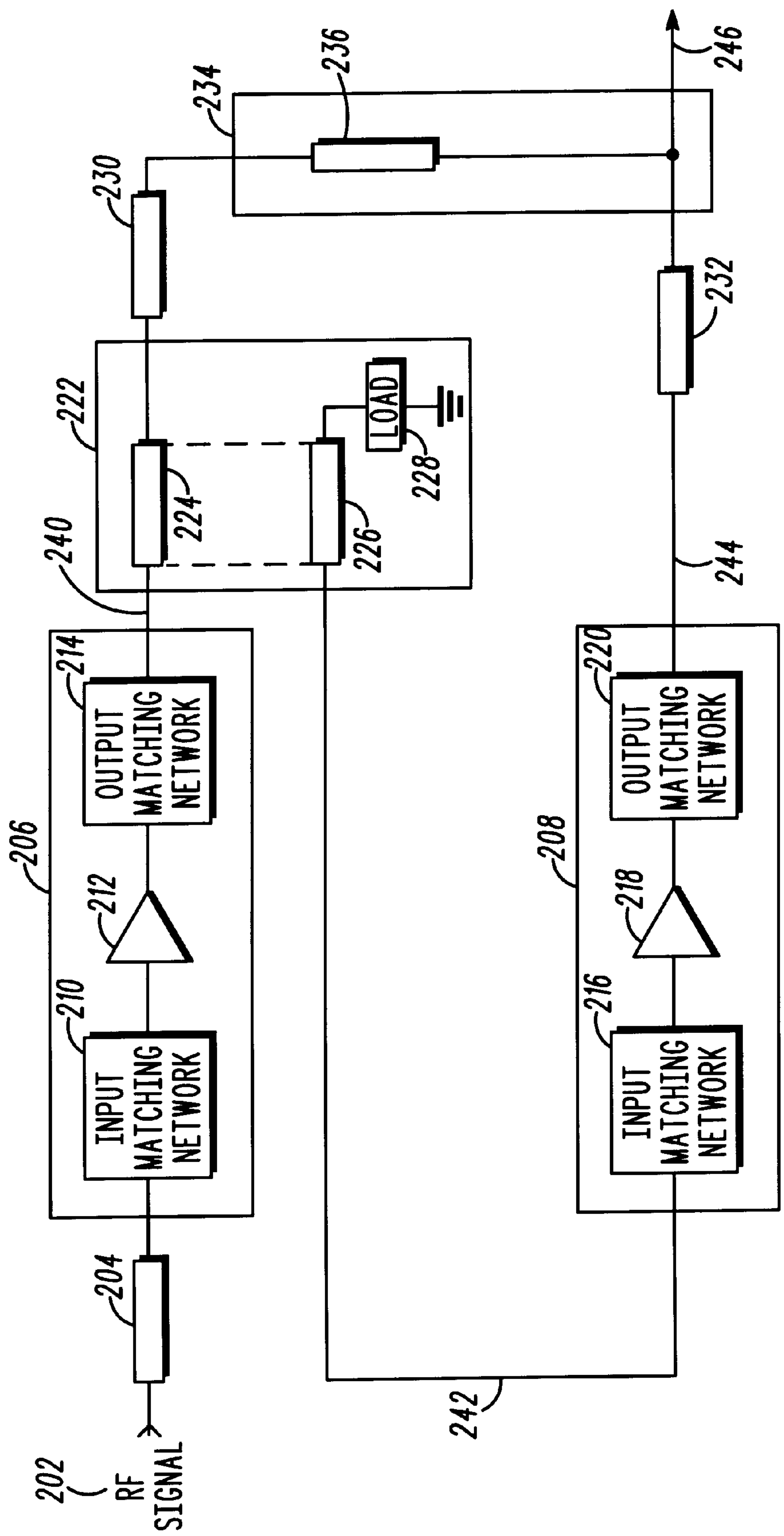
FIG. 2 is a schematic and block diagram illustration of a radio frequency amplifier structure in accordance with a preferred embodiment of the present invention.

The present invention can be more fully understood with reference to FIGS. 2–5. FIG. 2 is a schematic and block diagram illustration of an RF amplifier structure 200 in accordance with a preferred embodiment of the present invention. The RF amplifier structure 200 comprises two RF amplifier stages 206, 208, a signal coupler 222 coupled to an output of RF amplifier stage 206 and an input of RF amplifier stage 208, several transmission lines 204, 230, 232, and a signal combiner 234 coupled to the output of RF amplifier stage 206 and an output of RF amplifier stage 208. Preferably, each RF amplifier stage 206, 208 comprises a respective input matching network 210, 216, RF amplifier 212, 218, and output matching network 214, 220.

In the preferred embodiment, the signal coupler 222 is a directional coupler that includes two parallel transmission lines 224, 226 and a complex load 228. Preferably, the load 228 is comprised of a combination of one or more capacitive, inductive, and/or resistive components that are used to optimize the directivity of the directional coupler. In an alternate embodiment, the signal coupler 222 might comprise a capacitor or a resistor that couples the output of RF amplifier stage 206 to the input of RF amplifier stage 208. The signal combiner 234 comprises a transmission line 236.

In the preferred embodiment, an RF input signal 202 is coupled to the input of RF amplifier stage 206. RF amplifier stage 206 applies a gain to the input signal 202 to produce an amplified RF signal 240. The signal coupler 222 couples a portion of amplified RF signal 240 from the output of RF amplifier stage 206 to produce an attenuated version of amplified RF signal 240 as an input RF signal 242 to RF amplifier stage 208. RF amplifier stage 208 applies a gain, preferably equal to the gain applied by RF amplifier stage 206, to the RF signal 242 to produce amplified RF signal 244. The amplified RF signals 240, 244 are then combined in the signal combiner 234 to produce an output signal 246. The lengths of the transmission lines 230 and 232 are designed to provide whatever phase correction is required in order for the amplified RF signals 240, 244 to be in-phase when combined. By using a portion of the amplified RF signal 240 produced by amplifier stage 206 as the input RF signal 242 for RF amplifier stage 208, the present invention eliminates the need for a signal splitter and thereby provides up to 3 dB more gain overall as compared to a corresponding prior art RF amplifier structure that includes a 3 dB signal splitter to supply the input signals for both RF amplifier stages 206, 208.

For example, suppose the RF amplifiers 212, 218 of the RF amplifier stages 206, 208 are power transistors that provide 10 dB of gain at the frequency of interest. In order to produce a combined output signal 246 of 100 watts (50 dBm) while driving each RF amplifier 212, 218 with the same level of input power, an RF input signal 202 of 5.3 watts (~37.2 dBm) is needed to be coupled into the RF amplifier stage 206. Applying a gain of 10 dB results in the RF amplifier 212 producing an output signal 240 of 53 watts (~47.2 dBm). Assuming the signal coupler 222 couples one-tenth of the power of amplified signal 240 (i.e. signal coupler 222 is a 10 dB coupler), the input signal 242 to RF amplifier stage 208 is one-tenth of 53 watts, or 5.3 watts. Losing 5.3 watts to the input RF signal 242 to RF amplifier stage 208, the remaining power in the output signal 240 of RF amplifier stage 206 is 47.7 watts. RF amplifier stage 208 applies a 10 dB gain to the coupled 5.3 watt (~37.2 dBm) input RF signal 242, producing an output signal 244 of 53 watts (~47.2 dBm). The output of RF amplifier stages 206, 208 are then combined to produce a combined output signal 246 of 47.7 watts +53 watts=100.7 watts (~50.0 dBm). Since the RF input signal 202 into the RF amplifier structure 200 is 5.3 watts (~37.2 dBm), the total gain is approximately 12.8 dB. By contrast, the gain for a typical configuration of two parallel 50 watt, 10 dB RF amplifier stages preceded by a 3 dB splitter, as described above in the prior art, is only 10 dB.

In an alternate embodiment of the RF amplifier structure 200, the gains of RF amplifier stages 206, 208 are different. An example of an application of such an RF amplifier structure 200 is a Doherty-type amplifier, wherein RF amplifier stage 206 is a carrier amplifier stage and RF amplifier stage 208 is a peaking amplifier stage. In a Doherty-type amplifier, the RF amplifier 212 in the carrier amplifier stage 206 is typically biased class AB and the RF amplifier 218 in the peaking amplifier stage 208 is typically biased class C. The RF amplifier 218 in the peaking amplifier stage 208 is designed to turn on only when the RF input signal 202 achieves a specified amplitude level (generally high enough to operate the RF amplifier 212 in the carrier amplifier stage 206 near saturation) due to the peaking stage RF amplifier's class C bias. In this embodiment, the signal coupler 222 is designed to introduce a specified level of attenuation of amplified RF signal 240 so that the input RF signal 242 to peaking amplifier stage 208 will turn on RF amplifier 218 only when the RF amplifier 212 in the carrier amplifier stage 206 nears saturation.

In a second alternate embodiment of the RF amplifier structure 200, the RF amplifier structure 200 does not include the signal combiner 234. The RF amplifier structure 200 operates as described above with respect to FIG. 2, except the amplified RF signals 240, 244 are not combined. For example, each amplified RF signal 240, 244 might be used as an input signal for a succeeding RF amplifier structure.

Figure 3:
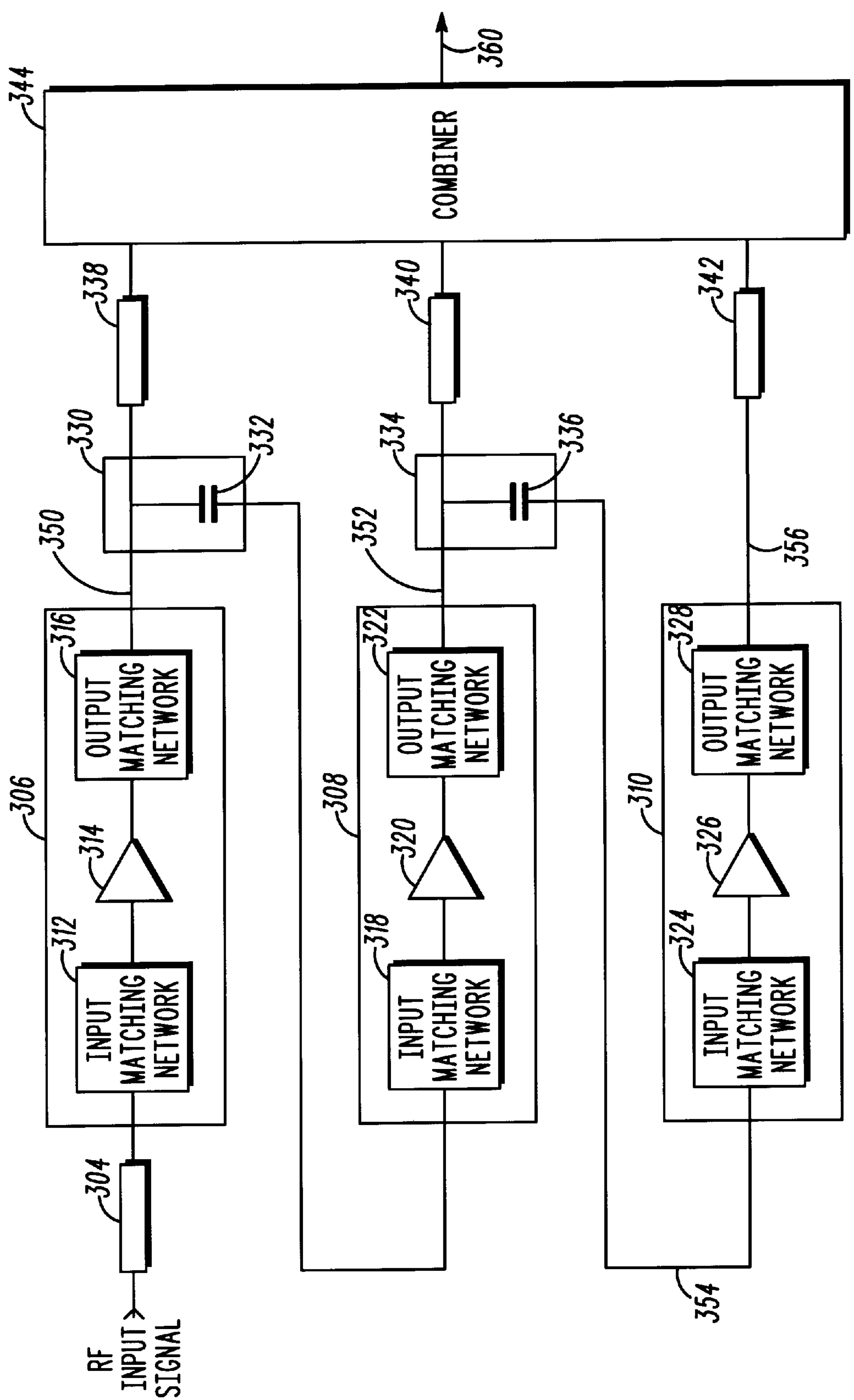
FIG. 3 is a schematic and block diagram illustration of a radio frequency amplifier structure in accordance with an alternate embodiment of the present invention.

FIG. 3 depicts a third alternate embodiment of the RF amplifier structure 200. In FIG. 3, the RF amplifier structure 300 comprises three RF amplifier stages 306, 308, 310, two signal couplers 330, 334, several transmission lines 304, 338, 340, 342, and a signal combiner 344 coupled to an output of each of the RF amplifier stages 306, 308, 310. Signal coupler 330 is coupled to the output of RF amplifier stage 306 and an input of RF amplifier stage 308. Signal coupler 334 is coupled to the output of RF amplifier stage 308 and an input of RF amplifier stage 310. Preferably, each RF amplifier stage 306, 308, 310 comprises a respective input matching network 312, 318, 324, RF amplifier 314, 320, 326 and output matching network 316, 322, 328, and each signal coupler 330, 334 comprises a respective capacitor 332, 336.

In the RF amplifier structure 300, RF amplifier stage 306, the signal coupler 330, and RF amplifier stage 308 operate as described above with respect to FIG. 2 to produce amplified RF signals 350, 352. Signal coupler 334 then couples a portion of amplified RF signal 352 from the output of RF amplifier stage 308 to produce an attenuated version of amplified RF signal 352 as the input RF signal 354 to RF amplifier stage 310. RF amplifier stage 310 applies a gain, preferably equal to the gains applied by RF amplifier stages 306, 308, to the RF signal 354 to produce amplified RF signal 356. The amplified RF signals 350, 352, 356 are then combined in the signal combiner 344 to produce an output signal 360. The lengths of the transmission lines 338, 340, and 342 are designed to provide whatever phase correction is required in order for the amplified RF signals 350, 352, and 356 to be in-phase when combined.

In a fourth alternate embodiment of the RF amplifier structure 200, the RF amplifier structure 200 further comprises an $n^{th}$ signal coupler and an $n+1^{th}$ RF amplifier stage, n=2,3,4, . . . . Each $n^{th}$ signal coupler is coupled to an output of a preceding $n^{th}$ RF amplifier stage and to an input of a succeeding $n+1^{th}$ RF amplifier stage. The output of the preceding $n^{th}$ RF amplifier stage and an output of the succeeding $n+1^{th}$ RF amplifier stage are coupled to the signal combiner 234. Similar to the preferred embodiment, each $n^{th}$ signal coupler couples a portion of the $n^{th}$ amplified signal from the output of the preceding $n^{th}$ RF amplifier stage to produce an attenuated $n^{th}$ amplified RF signal. The attenuated $n^{th}$ amplified RF signal is input into the succeeding $n+1^{th}$ RF amplifier stage. The succeeding $n+1^{th}$ RF amplifier stage applies a gain, preferably equal to the first and second gains, to the attenuated $n^{th}$ amplified RF signal to produce an $n+1^{th}$ amplified RF signal, which $n+1^{th}$ amplified RF signal is then combined in the signal combiner 234 with amplified RF signals from all of the other RF amplifier stages to produce a combined output signal.

For example, suppose that instead of the two RF amplifier stages in the preceding example there are four RF amplifier stages being operated in parallel. Again, the transistors in each of the stages are power transistors that provide 10 dB of gain at the frequency of interest and the signal couplers are 10 dB couplers. An output of the first RF amplifier stage is coupled via a first signal coupler to an input of a second RF amplifier stage and provides an input signal for the second stage, an output of the second RF amplifier stage is coupled via a second signal coupler to an input of a third RF amplifier stage and provides an input signal for the third stage, and an output of the third RF amplifier stage is coupled via a third signal coupler to an input of a fourth RF amplifier stage and provides an input signal for the fourth stage. Similar to the description above of the two amplifier stages operating in parallel, the first RF amplifier stage will require an input signal of 5.4 watts to produce an output signal of 54 watts. The first signal coupler will couple 5.4 watts to the input of the second RF amplifier stage, leaving a net first RF amplifier stage output signal of 48.6 watts. Similarly, the second RF amplifier stage will produce an output signal of 54 watts, of which 5.4 watts will be coupled by the second signal coupler to the input of the third RF amplifier stage, leaving a net second RF amplifier stage output signal of 48.6 watts. The third RF amplifier stage will produce an output signal of 54 watts, of which 5.4 watts will be coupled by the third signal coupler to the input of the fourth RF amplifier stage, leaving a net third RF amplifier stage output signal of 48.6 watts. And the fourth RF amplifier stage will produce an output signal of 54 watts. Thus, the four stages, when combined, produce a combined output signal of 200 watts (53.0 dBm) from an initial input signal of 5.4 watts (37.3 dBm), or a total gain of 15.7 dB. By contrast, the gain for a typical configuration of four parallel RF amplifier stages preceded by three 3 dB splitters, as described above in the prior art, is only 10 dB.

As described above, the present invention provides a splitter-less apparatus for amplifying an RF signal, which apparatus can yield up to 3 dB more gain overall than a typical RF amplifier configuration of two parallel RF amplifier stages or up to 6 dB more gain overall than a typical RF amplifier configuration of four parallel RF amplifier stages, at no additional cost. Instead of using a 3 dB splitter to couple an RF input signal to multiple RF amplifier stages, the present invention couples the RF input signal to a first RF amplifier stage only. The first RF amplifier stage applies a first gain to the RF input signal to produce a first amplified RF signal. A signal coupler then couples an attenuated version of the first amplified RF to an input of a second RF amplifier stage, where a second gain is applied to the attenuated first amplified RF signal to produce a second amplified RF signal. The outputs of the first and second RF amplifier stages are then combined in the signal combiner to produce a combined output signal. By using the attenuated version of the first amplified RF signal as the input for the second RF amplifier stage, the required power level of the entire structure's RF input signal is reduced. Furthermore, the present invention provides for additional stages to be added to an RF amplifier configuration with negligible impact on the required power level of the RF input signal.

Figure 4:
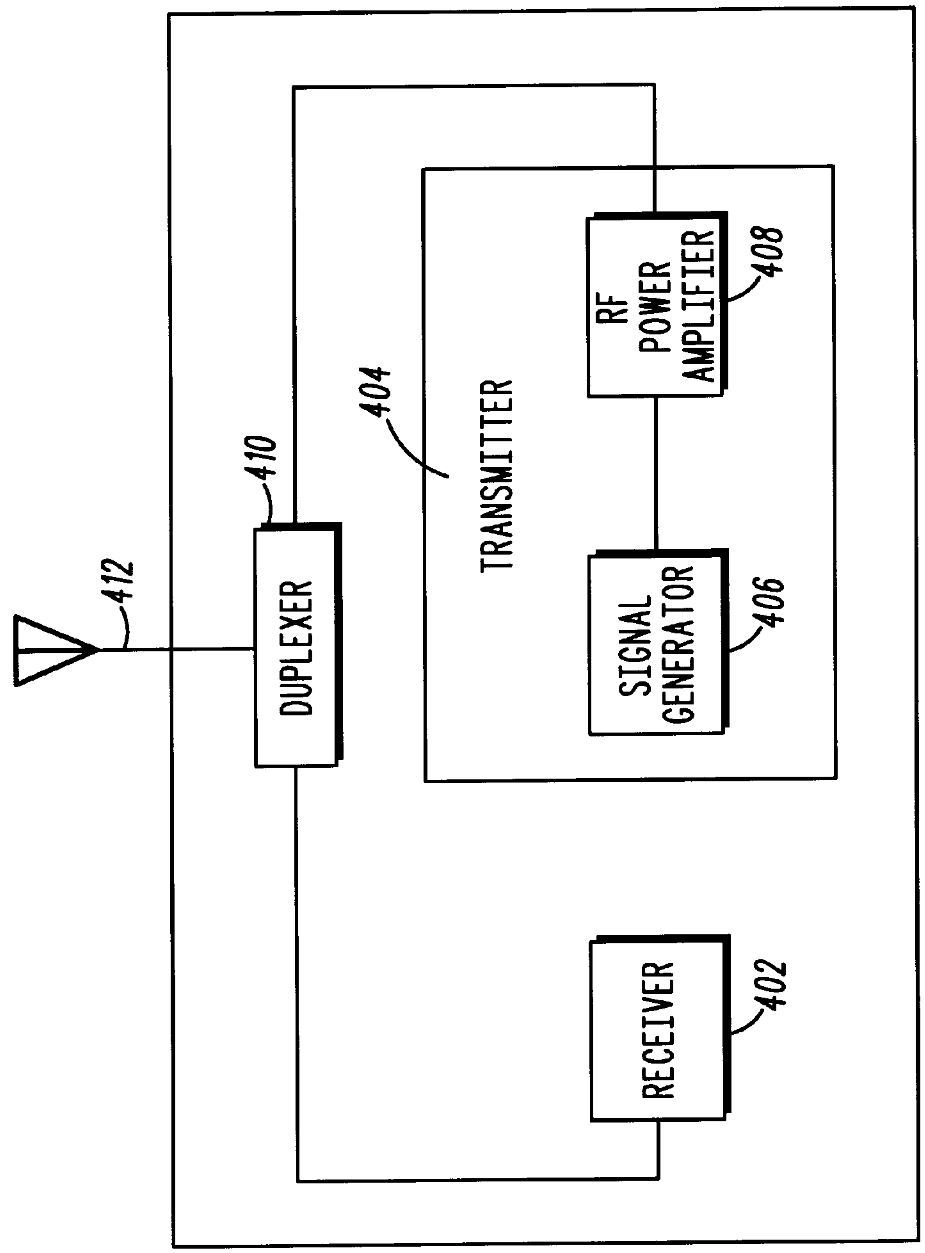
FIG. 4 is a block diagram illustration of a communication device in accordance with a preferred embodiment of the present invention.

FIG. 4 illustrates a communication device 400 in accordance with the present invention. The communication device 400 preferably comprises a wireless communication device, such as a mobile or portable radio telephone, a wireless data terminal, or a base station, and includes a receiver 402, a transmitter 404, a duplexer 410, and an antenna 412. Alternatively, instead of the duplexer 410, the communication device 400 could comprise at least two antennas, one antenna being coupled to the transmitter 404 and another antenna being coupled to the receiver 402. The receiver 402 preferably comprises a demodulator, a bandpass filter, local oscillators, mixers, and an intermediate frequency filter. The transmitter 404 preferably comprises a signal generator 406 and an RF power amplifier 408. The RF power amplifier 408 comprises any one of the RF amplifier structures described above with respect to FIGS. 2 and 3.

In the preferred embodiment, an RF signal generated by the signal generator 406 is routed to the RF power amplifier 408. The RF signal is received by the RF power amplifier 408 and amplified as described above with respect to FIGS. 2 and 3. The RF amplifier structure 200 improves the gain performance of the transmitter 404 as a whole by providing for up to 3 dB more gain overall than would have been the case for a typical RF amplifier structure 100, as described above in the prior art, of two parallel RF amplifier stages with a 3 dB signal splitter coupled to inputs to the two parallel RF amplifier stages.

Figure 5:
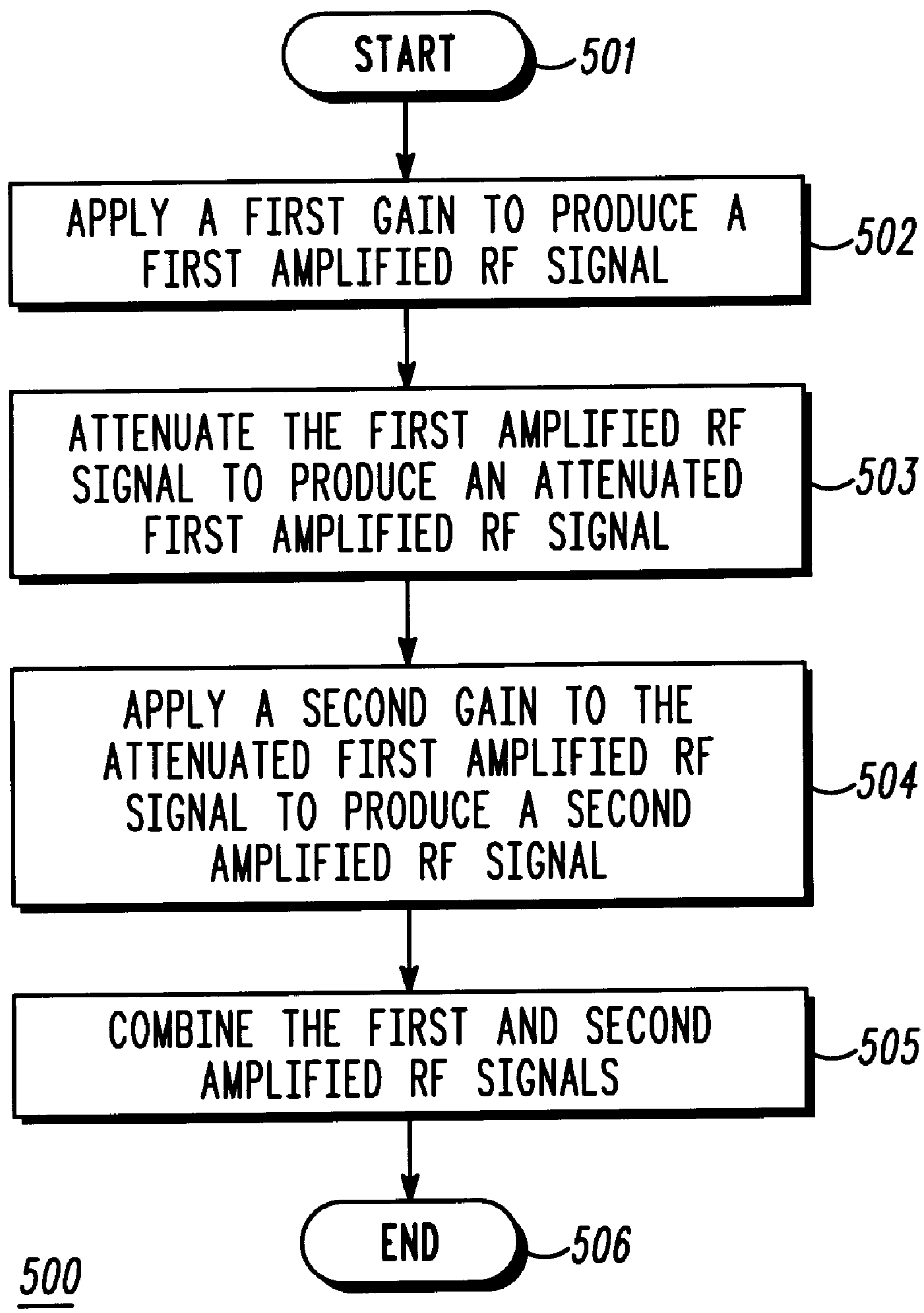
FIG. 5 is a logic flow diagram of steps executed by a communication device in order to amplify a radio frequency signal in accordance with a preferred embodiment of the present invention.

FIG. 5 illustrates a logic flow diagram 500 of steps executed by a communication device in order to amplify an RF signal in accordance with a preferred embodiment of the present invention. The logic flow begins (501) when the communication device applies (502) a first gain to the RF signal to produce a first amplified RF signal. The communication device then attenuates (503) the first amplified RF signal to produce an attenuated first amplified RF signal. In the preferred embodiment, the communication device attenuates the first amplified RF signal by use of a signal coupler, such as a directional coupler. The communication device applies (504) a second gain, preferably equal to the first gain, to the attenuated first amplified RF signal to produce a second amplified RF signal. The communication device then combines (505), preferably via a signal combiner, the first amplified RF signal and the second amplified RF signal to produce an output signal, and the logic flow ends (506).

In an alternate embodiment of the present invention, the communication device also attenuates the second amplified RF signal to produce an attenuated second amplified RF signal, applies a third gain, preferably equal to the first and second gains, to the attenuated second amplified RF signal to produce a third amplified RF signal, and combines the third amplified RF signal together with the first amplified RF signal and the second amplified RF signal to produce an output signal.

Generally, the present invention encompasses an apparatus and a method for amplifying an RF signal. With this invention, the required power level of an RF input signal necessary for achieving a particular combined output signal power level is reduced. Instead of splitting the RF input signal into multiple branches and applying a separate gain to each branch as is typically done in parallel stage RF amplifier configurations, the present invention applies the RF input signal to the first stage only. Input RF signals for each successive parallel RF amplifier stage is provided by coupling a portion of the output signal of a preceding stage to an input of a succeeding stage. The result is that up to 3 dB more gain can be achieved than would have been achieved for a typical RF power amplifier configuration comprising two RF amplifier stages whose inputs are coupled to a 3 dB signal splitter, and up to 6 dB more gain can be achieved than would have been achieved for a typical RF power amplifier configuration comprising four RF amplifier stages whose inputs are coupled to a succession of 3 dB signal splitters. And additional RF amplifier stages may be added at negligible impact to the power level of the RF input signal.

Those of ordinary skill in the art appreciate that a variety of directional coupler and signal combiner designs may be used to accomplish the circuit operations herein. The use of the particular directional coupler and signal combiner designs used herein is meant to present to the reader examples of such circuits in an effort to better illustrate the principles of the present invention. Also, while the present invention has been particularly shown and described with reference to particular embodiments thereof, it will be understood by those of ordinary skill in the art that various changes in form and details may be made therein without departing from the spirit and scope of the present invention.

I claim:

1. A radio frequency amplifier structure, comprising:

a first radio frequency amplifier stage that applies a first gain to a radio frequency signal to produce a first amplified radio frequency signal;

a signal coupler, coupled to an output of the first radio frequency amplifier stage, that couples a portion of the first amplified radio frequency signal to produce an attenuated first amplified radio frequency signal;

a second radio frequency amplifier stage, coupled to the signal coupler, that applies a second gain to the attenuated first amplified radio frequency signal to produce a second amplified radio frequency signal; and a signal combiner, coupled to the output of the first radio frequency amplifier stage and an output of the second radio frequency amplifier stage, that combines the first amplified radio frequency signal and the second amplified radio frequency signal.

2. The radio frequency amplifier structure of claim 1, wherein the first gain is substantially equal to the second gain.

3. The radio frequency amplifier structure of claim 1, further comprising:

a second signal coupler, coupled to the output of the second radio frequency amplifier stage, that couples a portion of the second amplified radio frequency signal to produce an attenuated second amplified radio frequency signal; and a third radio frequency amplifier stage, coupled to the second signal coupler and the signal combiner, that applies a third gain to the attenuated second amplified radio frequency signal to produce a third amplified radio frequency signal, wherein the signal combiner combines the first amplified radio frequency signal, the second amplified radio frequency signal, and the third amplified radio frequency signal.

4. The radio frequency amplifier structure of claim 3, wherein the first gain, the second gain, and the third gain are all substantially equal.

5. The radio frequency amplifier structure of claim 1, wherein the signal coupler comprises a directional coupler.

6. The radio frequency amplifier structure of claim 1, wherein the signal coupler comprises a capacitor.

7. A method for amplifying a radio frequency signal, comprising the steps of:

applying a first gain to the radio frequency signal to produce a first amplified radio frequency signal;

attenuating the first amplified radio frequency signal to produce an attenuated first radio frequency signal;

applying a second gain to the attenuated first radio frequency signal to produce a second amplified radio frequency signal; and combining the first amplified radio frequency signal and the second amplified radio frequency signal to produce an output signal.

8. The method of claim 7, further comprising the steps of:

attenuating the second amplified radio frequency signal to produce an attenuated second radio frequency signal;

applying a third gain to the attenuated second radio frequency signal to produce a third amplified radio frequency signal; and wherein the step of combining comprises the step of combining the first amplified radio frequency signal, second amplified radio frequency signal, and third amplified radio frequency signal to produce the output signal.

9. A communication device, comprising:

a transmitter having a radio frequency amplifier structure, the radio frequency amplifier structure comprising:

a first radio frequency amplifier stage that applies a first gain to a radio frequency signal to produce a first amplified radio frequency signal;

a signal coupler, coupled to an output of the first radio frequency amplifier stage, that couples a portion of the first amplified radio frequency signal to produce an attenuated first amplified radio frequency signal;

a second radio frequency amplifier stage, coupled to the signal coupler, that applies a second gain to the attenuated first amplified radio frequency signal to produce a second amplified radio frequency signal; and a signal combiner, coupled to the output of the first radio frequency amplifier stage and an output of the second radio frequency amplifier stage, that combines the first amplified radio frequency signal and the second amplified radio frequency signal.

10. The communication device of claim 9, wherein the first gain is substantially equal to the second gain.

* * * * *